United States Patent [19]

Billman et al.

[11] Patent Number: 4,726,776

[45] Date of Patent: Feb. 23, 1988

[54] SOCKET FOR ZIG-ZAG INLINE PACKAGE

[75] Inventors: Timothy B. Billman, King; Joseph R. Goodman, Walkertown; Gary R. Marpoe, Jr., Winston-Salem, all of N.C.

[73] Assignee: AMP Incorporated, Harrisburg, Pa.

[21] Appl. No.: 872,740

[22] Filed: Jun. 10, 1986

[51] Int. Cl.⁴ ...................... H01R 23/72; H01R 13/66
[52] U.S. Cl. ........................................ 439/70; 439/620
[58] Field of Search .......... 339/17 CF, 198 G, 198 H, 339/147 R; 333/185; 439/70-73, 259-265, 296, 525, 526, 620, 660, 682, 686-691, 712, 715, 717, 724, 842, 858, 861

[56] References Cited

U.S. PATENT DOCUMENTS

| | | | |
|---|---|---|---|
| 848,505 | 3/1907 | Steinberger | 339/198 G |
| 2,724,814 | 11/1955 | Stubbers | 339/198 G |
| 2,855,579 | 10/1958 | Wintriss | 439/381 |
| 3,880,493 | 4/1975 | Lockhart, Jr. | 439/525 |
| 4,060,296 | 11/1977 | Kunkle et al. | 439/70 |
| 4,082,408 | 4/1978 | Angelis | 339/198 G |
| 4,356,532 | 10/1982 | Donaher et al. | 339/17 CF |
| 4,377,319 | 3/1983 | MacDougall | 339/17 CF |
| 4,418,974 | 12/1983 | MacDougall | 339/17 CF |
| 4,428,633 | 1/1984 | Lundergan et al. | 339/17 CF |
| 4,478,476 | 10/1984 | Jones | 339/147 R |
| 4,541,034 | 9/1985 | Fanning | 339/17 C |
| 4,606,599 | 8/1986 | Grant et al. | 339/176 M |

FOREIGN PATENT DOCUMENTS 58188184  9/1985  Japan.

OTHER PUBLICATIONS

European Search Report RS 78183US.
European Search Report dated 3-7-87 from European Patent Office, labeled "Attachment A".
FIGS. 1, 2 & 3 of KEL Socket Labeled "Attachment B".
Connector Technology, Nov. 1986, p. 62.

Primary Examiner—Gil Weidenfeld
Assistant Examiner—Gary F. Paumen
Attorney, Agent, or Firm—Eric J. Groen

[57] ABSTRACT

A connector for interconnecting a zig-zag inline package to a printed circuit board has a plurality of contacts in two parallel and offset rows. The contacts are dimensionally controlled to be preloaded only when installed in the housing cavity, providing predictable preload and resultant insertion force. The connector also includes a decoupling capacitor, integral with the contacts which contact the power and ground lead of the integrated circuit package.

20 Claims, 12 Drawing Figures

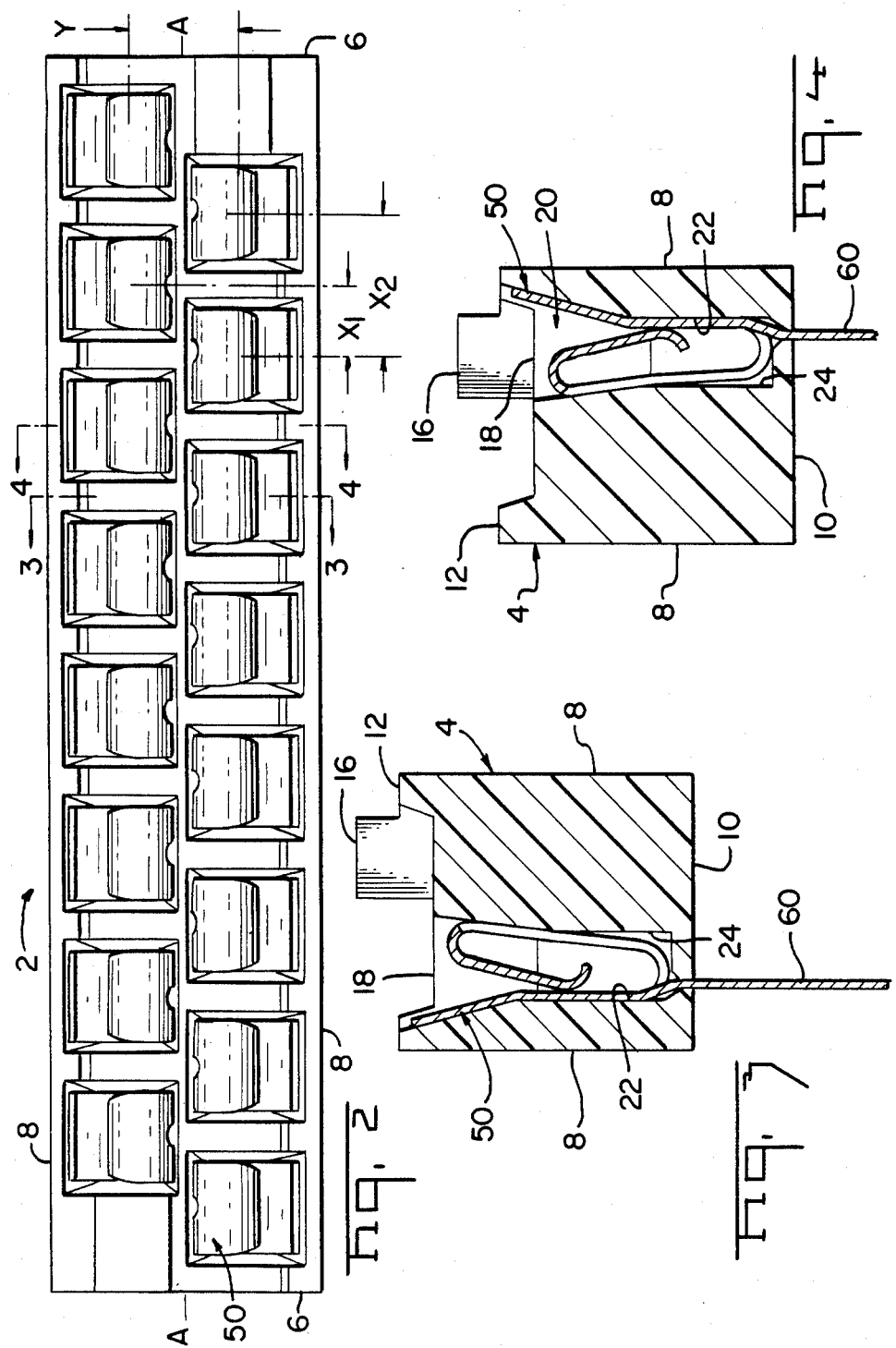

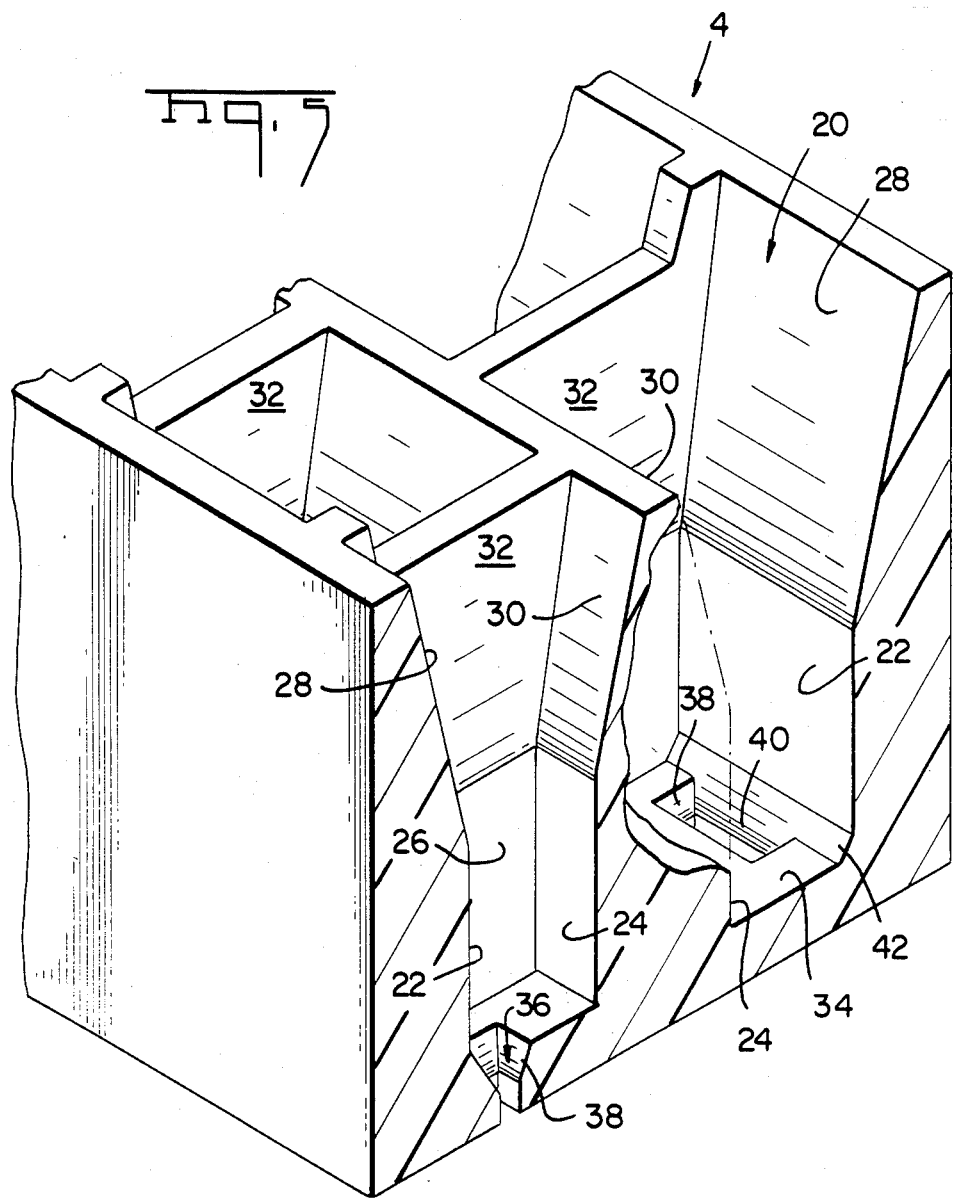

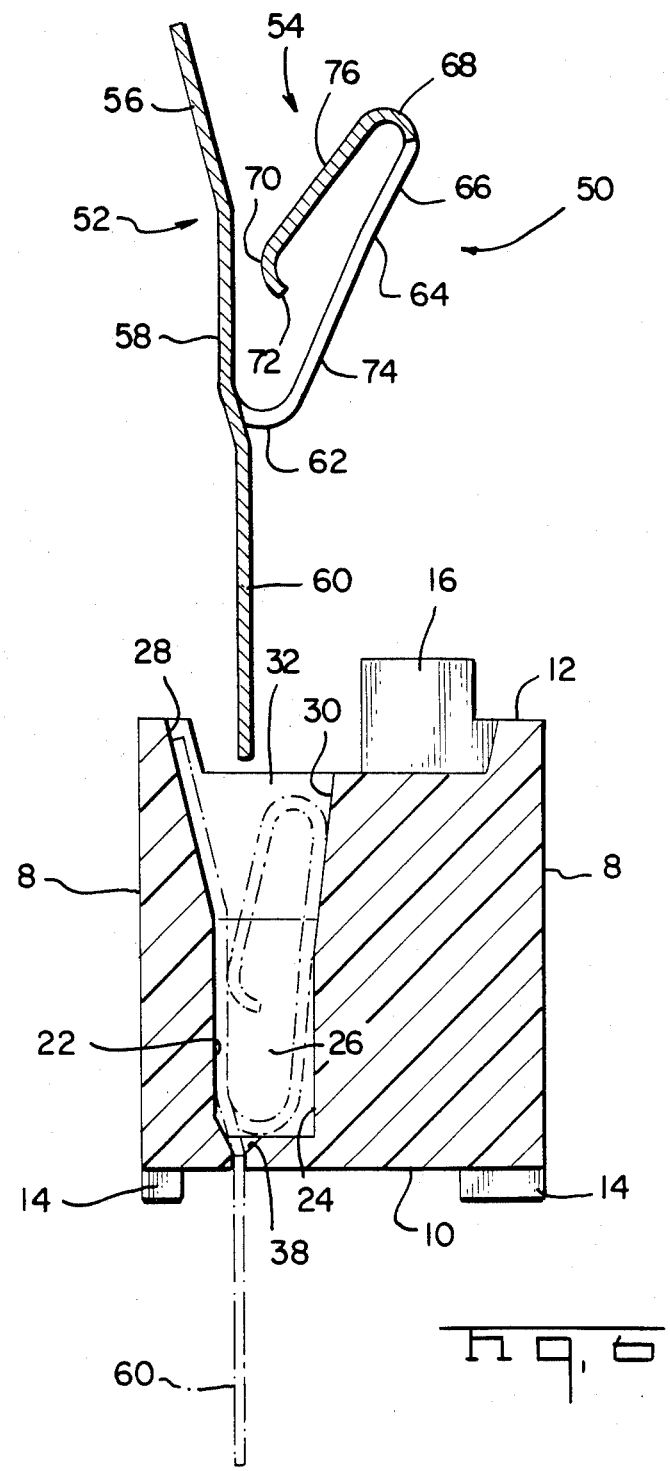

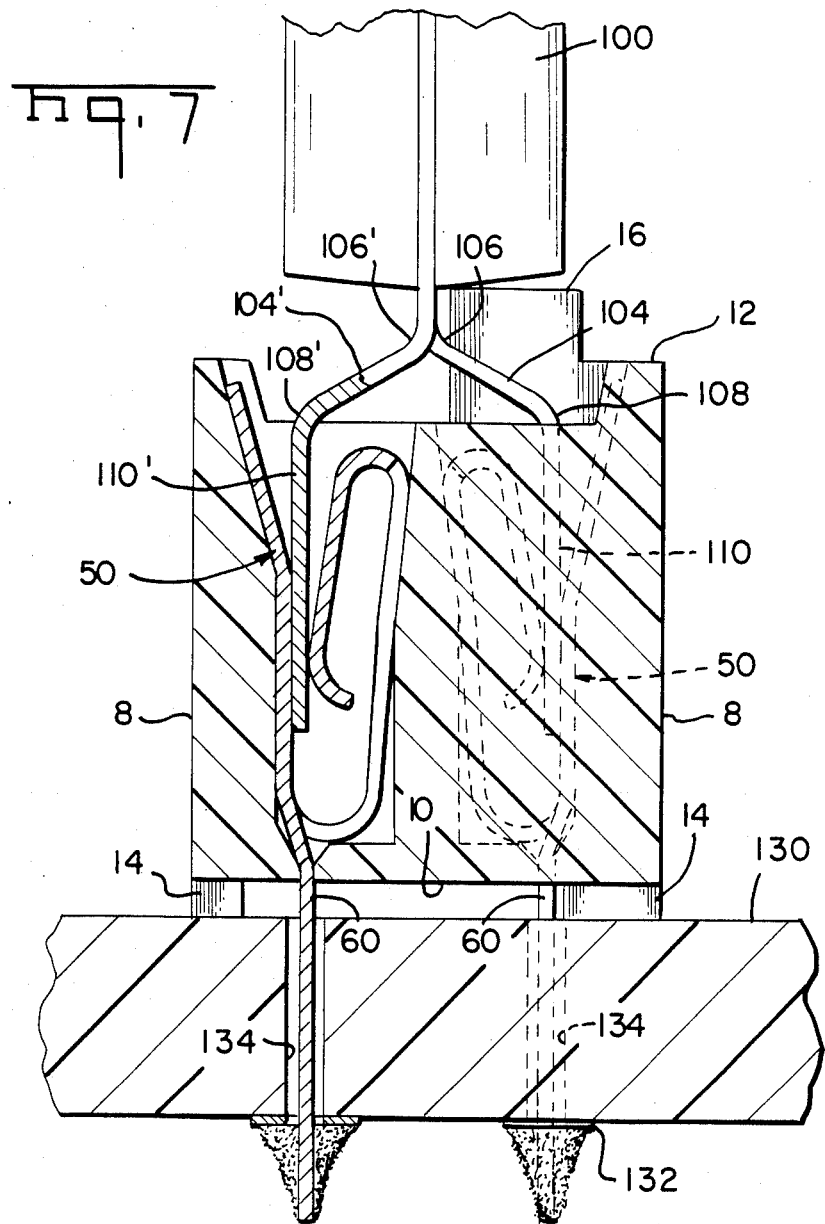

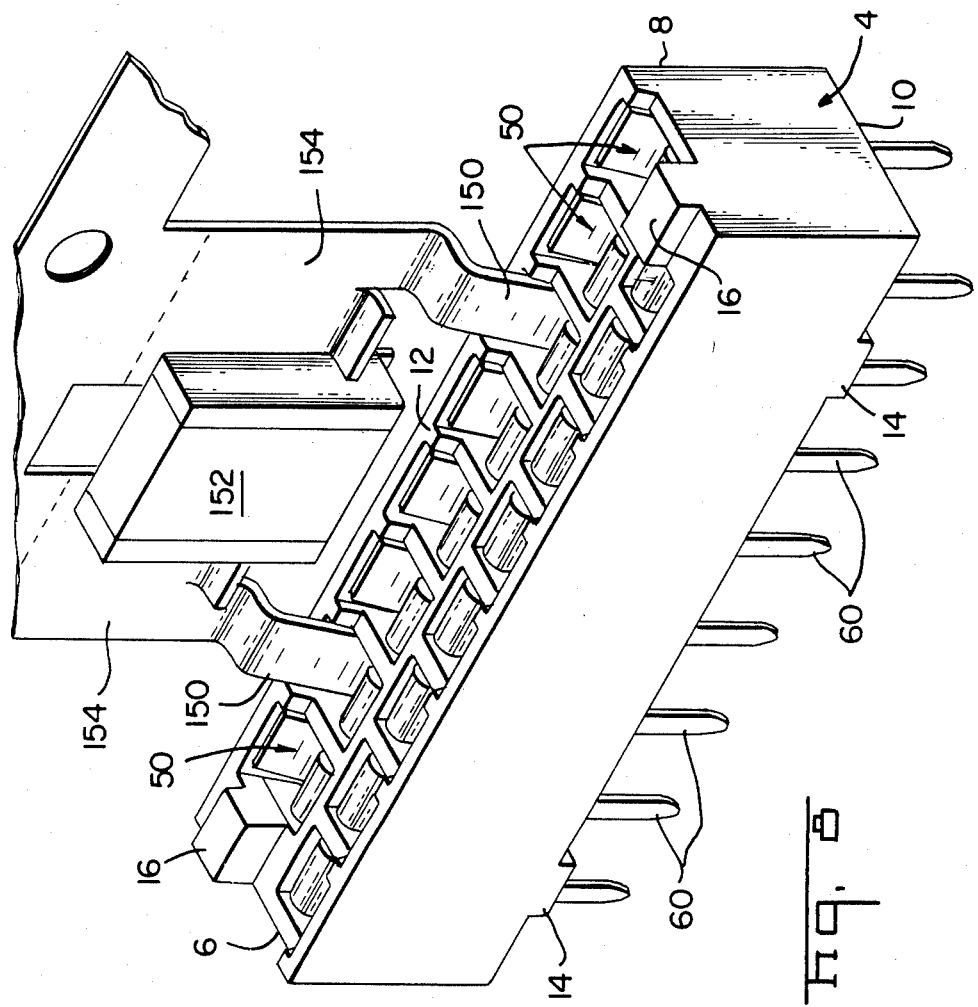

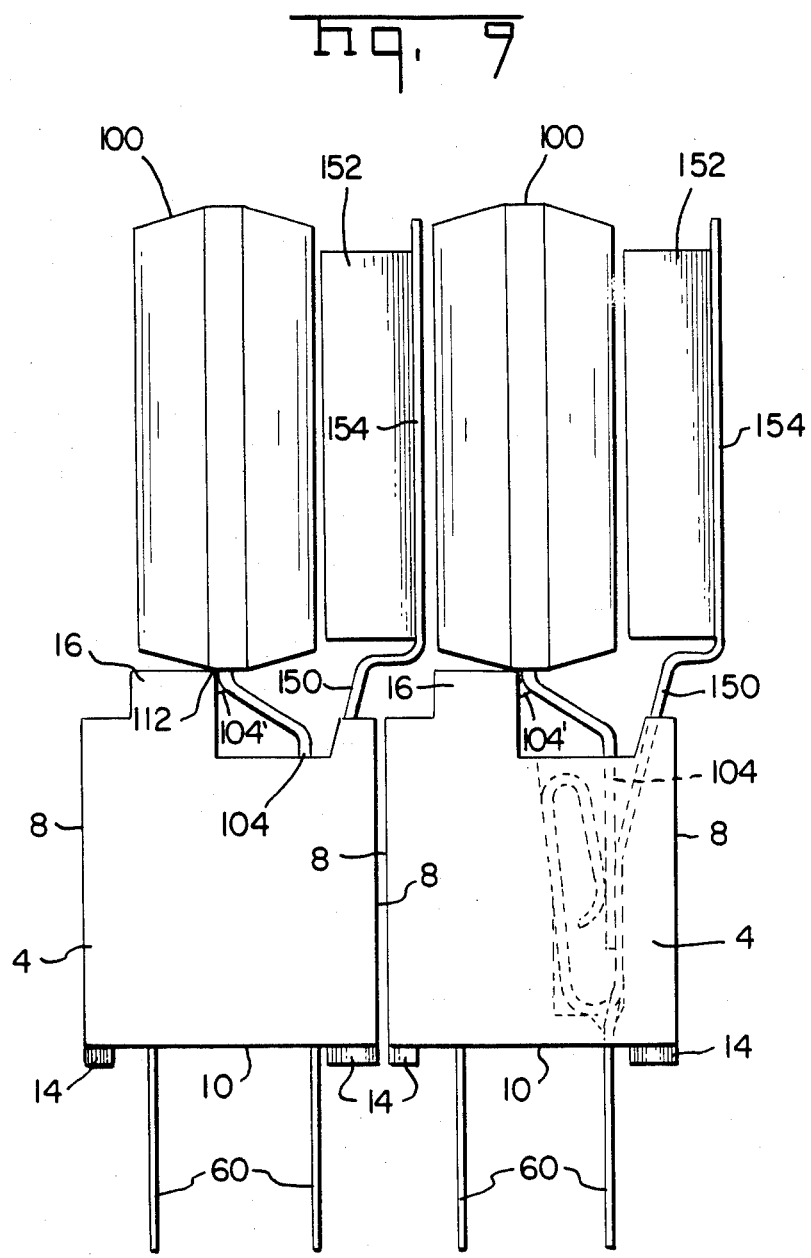

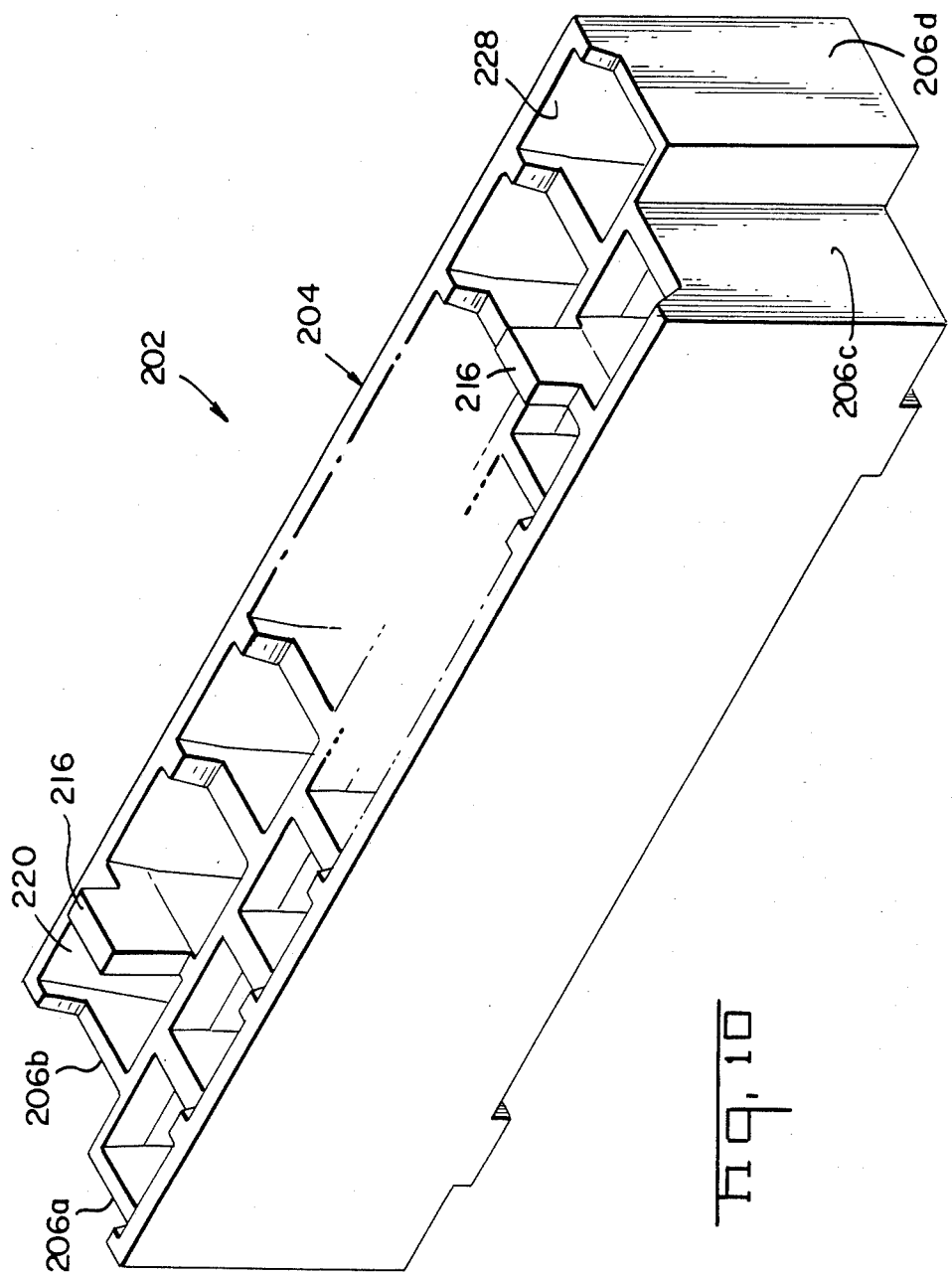

SOCKET FOR ZIG-ZAG INLINE PACKAGE

BACKGROUND OF THE INVENTION

1. Field of the Invention

The instant invention relates to a socket for mounting a printed circuit board and for interconnecting the leads of an integrated circuit in the configuration of a zig-zag inline package to the traces on the printed circuit board.

2. Prior Art

There is disclosed in U.S. Pat. No. 4,060,296, a carrier for interconnecting thereto a dual inline package integrated circuit. The disclosure of the above-referenced U.S. Pat. shows dual leaf contacts mounted within a carrier cavity. Dual leaf refers to the mating configuration between the contact leaves and the package lead, in that there is metal-to-metal contact between the package lead and the socket contact, on both sides of the package lead.

The dual inline package carrier, as disclosed in U.S. Pat. No. 4,060,296, however, was designed for DIP package having leads with lateral spacing on 0.100 inch centerlines, and 0.300 inch width between the opposed leads. Furthermore, a DIP package consists of package leads extending outwardly from sidewalls of the package, the bending downwardly. As the radius in the lead is at the package body, the DIP lead can handle at least 500 grams of insertion force before overstressing the DIP leads.

In the increasing need to preserve printed circuit board real estate, manufacturers of integrated circuit packages have introduced a new configuration known as the zig-zag inline package. The zig-zag inline package body is similar in design to that of the dual inline package, the major difference lies in the lead configuration. The zig-zag inline package leads extend from one side of the package only, every other lead being bent away from the axial centerline in the opposite direction forming two axial rows of leads. The leads on the zig-zag inline package in the same axial row have 0.100 inch centerlines, each lead being laterally offset 0.050 inch from the next offset lead. The distance between axial rows is now 0.100 inch, as opposed to 0.300 inch on the dual inline package. The leads on the zig-zag inline package extend downwardly from the package, are then formed by a first radius projecting the lead outward away from the axial centerline of the package, and then by a second radius bending the lead back towards the axial centerline until the leads are again extending downwardly. The leads of the zig-zag inline package are extremely sensitive to overstress at the first and second radius, overstressing at approximately 270 grams insertion force.

The socket configuration disclosed in U.S. Pat. No. 4,060,296 could not be utilized for the zig-zag inline package. The disclosure of the above-mentioned patent relates to the interconnections for square matrix packages whereas the zig-zag inline package has an offset configuration. Furthermore, as the socket contacts are laterally opposed, the distance between axial rows of contacts was 0.300 inch, and could not be reduced to 0.100 inch with the contacts directly opposed. The contacts as disclosed in the above-mentioned patents could not be utilized for the zig-zag inline package, as the insertion force on those contacts were not predictable enough to consistently maintain below a 270 gram insertion force. The contacts disclosed in U.S. Pat. No. 4,060,296 were formed with the two leaves in contact in a preloaded configuration. As the insertion force is directly related to the contact lead preload, and as the contact leaf preload cannot be consistently held, the insertion force could not be held consistently either.

In order to provide enough current to multiple integrated circuit packages requiring current simultaneously, and to protect the integrated circuit packages from voltage spikes during the package refresh cycle, printed circuit boards typically contain a decoupling capacitor surface mounted to the board, decoupling the package from the power source. The surface mounted capacitor, however, further reduces the printed circuit board space available for integrated circuits as the capacitor requires physical space for the capacitor and printed traces connected to the integrated circuit package leads. If the decoupling capacitors were remotely mounted from the printed circuit board, the printed circuit board would thereby be freed up for mounting integrated circuit package providing for a higher density system.

SUMMARY OF THE INVENTION

It is an object of the present invention to provide an electrical connector for interconnecting leads of a zig-zag inline package to a printed circuit board.

It is a further object of the invention to provide an electrical connector for zig-zag inline packages with electrical contacts having a predictable preload thereby producing a predictable insertion force on said integrated circuit package lead.

It is a further object to design an electrical connector with means preventing the leads of said integrated circuit package from being over inserted, thereby damaging the leads.

It is a further object to design an electrical connector having the capability of end-to-end stackability with the lateral centerline spacing of adjacent sockets equal to the lateral centerline spacing of contacts in the same socket.

It is a further object of the instant invention to provide a means to decouple the integrated circuit package from the power source.

Other objects will be apparent from the following detailed description.

The first objective is accomplished by providing a housing with a plurality of contact receiving cavities in parallel but offset rows, and contacts disposed in the cavities providing contact portions to both the integrated circuit package lead and the printed circuit board.

The second objective is accomplished by stamping and forming the electrical contacts such that no preload exists in the integrated circuit package lead contacting portion. The contact is dimensionally controlled to be biased to a preloaded condition only when inserted in the housing.

The third objective is accomplished by providing standoffs projecting from the package receiving face integral with the housing, to accurately locate the package leads within the contacts and prevent further insertion.

The fourth objective is accomplished by abutting the end cavities of adjacent cavities in adjacent sockets to keep the centerline spacing of adjacent cavities equal to the lateral spacing between adjacent cavities in the same socket.

The fifth objective is accomplished by providing a decoupling capacitor mounted to an electrically connected to the contacts which contact the power and ground leads of the integrated circuit package.

BRIEF DESCRIPTION OF THE DRAWINGS

FIG. 2 is a top plan view of the socket of the instant invention.

FIG. 3 is a cross section through lines 3—3 of FIG. 2.

FIG. 4 is a cross section through lines 4—4 of FIG. 2.

FIG. 5 is a cutaway view of the socket of the instant invention showing the terminal cavities.

FIG. 6 is similar to that of FIG. 3 showing the contact terminal exploded away from the carrier and a phantom view of the contact terminal installed in the carrier cavity.

FIG. 7 is a view similar to that of FIG. 3 showing the socket mounted to a printed circuit board and a zig-zag inline package installed in the carrier assembly.

FIG. 8 is a perspective view of the decoupling capacitor of the instant invention.

FIG. 9 is an end plan view showing the layout of two connectors with decoupling capacitors in side-by-side relation.

FIG. 10 is a perspective view of an alternate embodiment, partially broken away at one end.

DETAILED DESCRIPTION OF THE PREFERRED EMBODIMENT

Figure 1:
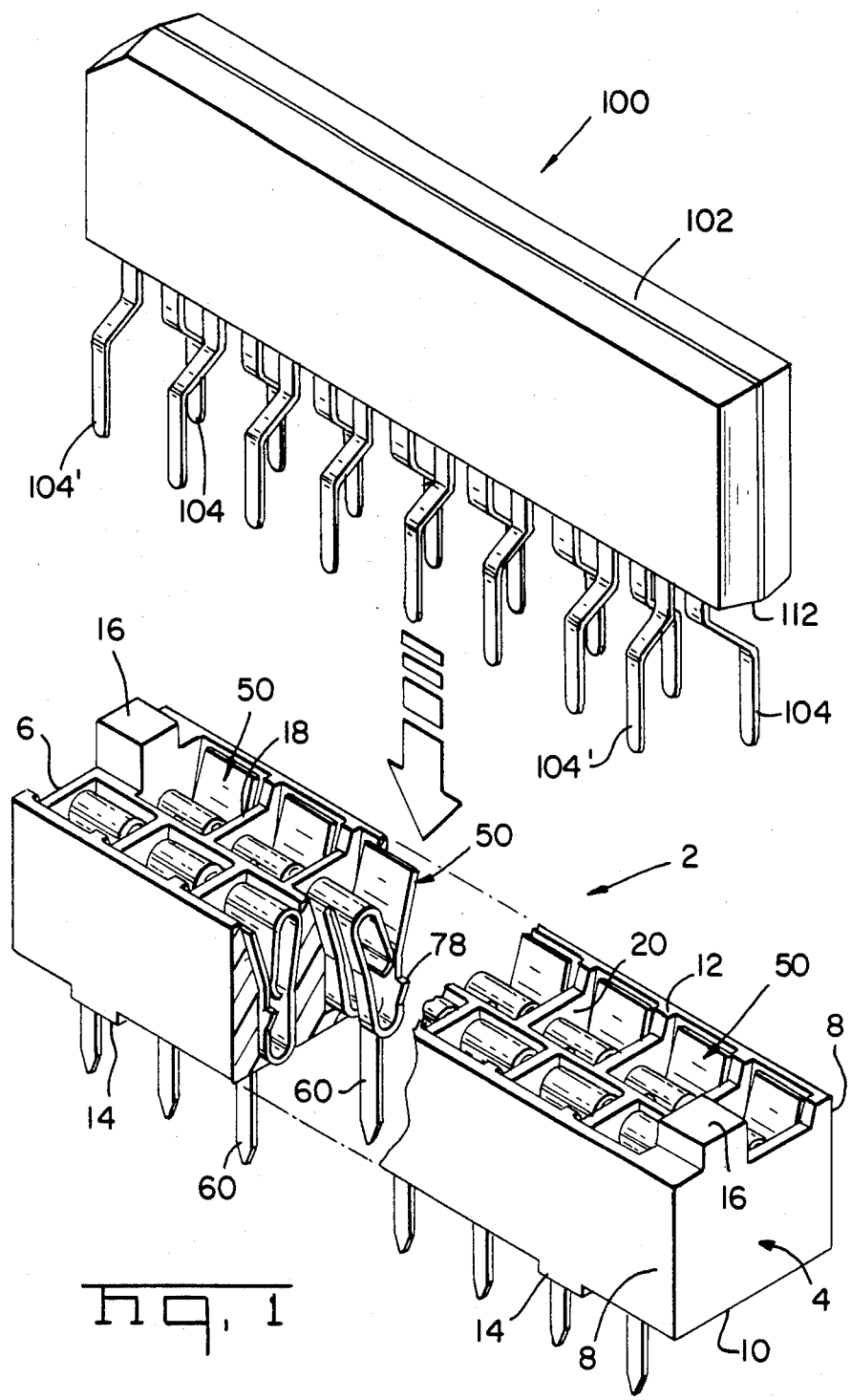
FIG. 1 is a perspective view of the socket of the instant invention showing the socket partially broken away, and the zig-zag inline package exploded away from the socket.

Referring now to FIG. 1, there is shown the socket 2 of the preferred embodiment poised for receiving a zig-zag inline package 100. The socket 2 comprises a socket housing 4 and a plurality of contacts 50 mounted therein.

Also shown in FIG. 1 is a zig-zag inline package 100 having a body 102 and leads 104, 104'. The leads 104, 104' all extend downwardly from wall 112, leads 104, 104' on the same axial centerline. As shown in FIG. 7, the package lead 104 extends downwardly and is then bent outwardly away from the axial centerline at radius 106. The lead then projects outwardly to a second radius 108 where the lead is bent back towards the axial centerline and extends downwardly as straight section 110. Lead 104' is bent in the same fashion as lead 104 at first and second radius 106', 108', but in the opposite direction in relation to the axial centerline. A typical zig-zag inline package which is commercially available is the Mitsubishi 256K DRAM, number MJM4256L-12.

Referring now to FIG. 2, the preferred embodiment is shown in a top plan view, where the axial direction will be referred to along lines A-A. The socket 2 includes a first and second row of contacts 50, the first row being laterally offset from the second row along the axial centerline, the first and second row of contacts 50 being spaced as the package leads 104, 104'. The distance Y attainable between rows of contacts, in the preferred embodiment is 0.100 inches. The lateral offset between the two rows, $X_1$, is 0.050 inches and the centerline spacing between contacts in the same row, $X_2$, is also 0.100 inches.

Referring again to FIG. 1, the socket 2 is shown as having a housing 4 having endwalls 6, sidewalls 8, a bottom wall 10, and a package receiving face 12. Extending from the bottom wall 10 are lower standoffs 14, and extending upwardly from the contact receiving face 12 are upper standoffs 16. The socket housing 4 further comprises a plurality of contact receiving cavities 20.

Referring now to FIG. 5, the cavities 20 are shown in greater detail. Cavities 20 are defined by a floor 34, outer sidewalls 22, inner sidewalls 24, and endwalls 26. The contact lead-in portion of cavity 20 is defined by outer beveled surfaces 28, inner beveled surfaces 30, and end beveled surfaces 32. At the bottom of the cavity 20 and extending through the floor 34 are aperture 36 having lead-in surfaces 38, 40 therearound. It should be noticed that a lead in surface 42 is located between the outer sidewalls 22 and the floor 34, and is continuous with lead in surface 40.

Referring now to FIG. 6, the contact 50 is shown exploded away from the connector body 4 and the cavity 20, and shown inserted in the cavity in phantom. Contact 50 includes a first and second leaf section 52, 54, respectively and a printed circuit board lead section 60.

Contact 50 is stamped and formed from flat metal shock. The first leaf section comprises a lead-in section 56 and a straight section 58. The printed circuit board contact 60 is stamped from the central portion of the contact 50, and is then bent downwardly, as best shown in FIGS. 1 and 6. Second leaf portion 54 begins with the stamping being bent at a first radius 62 projecting the stamping upwardly in the same direction as the first leaf portion 52, along a straight portion 74. The stamping has a portion 66 bent away from the straight portion 74, about a corner 64. The stamping is then again formed about a second radius 68, which projects the contact portion 70 inwardly towards the first leaf portion 52. It will be noticed from FIG. 6 that when the contact is not inserted in the cavity 20, the free state of the contact 50 is such that the first and second lead portions 52 and 54, respectively, do not contact each other. Rather, the first 62 and second radius 68, and corner 64 are accurately dimensioned to provide an unbiased relationship between the first and second leaves with the contact portion 70 positioned accurately away from the first leaf portion 52.

Upon insertion of the contact 50 into the cavity 20, the second leaf portion 54 is brought forward into contact with the first leaf portion 52. When the contact 50 is inserted into the cavity 20, the first and second leaves are centered in the cavity by beveled surfaces 28, 30 and 32. As the contact portions are mass inserted on carrier strips, it is important for beveled surfaces 28, 30 and 32 to center the contact portions. The straight portion 58 of the contact then lies adjacent to the outer cavity sidewall, the two surfaces in sliding relation with one anotehr. Further insertion of the contact 50 causes portion 74 of contact 50 to interfere with the inner beveled surface 30, and continued insertion causes beveled surface 30 to act as a camming surface, projecting the second leaf portion 54 into the first leaf portion 52. The contacts 50 are held in place within the cavity by the lances 78 (FIG. 1) sciving into the sidewalls 26 upon insertion.

Also upon insertion of the contact in the cavity 20, the printed circuit board contact 60 will follow beveled surface 28, outer sidewall 22, sidewall beveled surface 42 and into the aperture 36. As the contacts are mass inserted on carrier strips, it is important for the cavity to be designed to allow entry of the contact portion 60 and centering of the contact portion 60 into the aperture.

The fit between the contact portion and the aperture 36 is an interference fit, thereby sealing the interior part of the cavity from the printed circuit board side of the housing. As the connector 2 will eventually be soldered to a printed circuit board, the sealing feature of the aperture 36 will prevent solder and flux from wicking into the cavities 20.

When the contact is fully inserted, as shown in FIG. 6, the contact lead-in section 56 lies adjacent to surface 28, straight portion 58 lies adjacent to outer cavity sidewall 22 and section 66 lies adjacent to inner beveled surface 30, as shown in FIG. 6. As the surface 30 is beveled away from the cavity 20, the second radius 68 of contact 50 is larger than it could have been, had the sidewall 24 not contained the bevel 30, but rather, had continued as a straight wall.

As installed, the lead-in section 56 and section 76 form an opening for a lead of a zig-zag inline package, and contact portion 70 is biased against portion 58 with a predetermined preload. As the stamped configuration of the contact 50 in its free state is accurately held geometrically and as the contact cavity 50 is also dimensionally controlled, the deformation of the contact 50, upon insertion into the cavity 20, creates a predictable preload between the first and second lead portions 52, 54, respectively. As the insertion force is a function of the preload and the coefficient of friction between the package leads and the leaf sections of the contact, the insertion force of the package may also be consistently maintained.

The connector 2 may then be installed on the printed circuit board for receipt of a package. The connector 2 is placed on the printed circuit board 130 with the contact portions 60 extending through the printed circuit board throughholes 134 and the contact portions 60 soldered to the individual traces 132, as shown in FIG. 7. When the package 100 is inserted in the connector 2, the package leads 110, 110' are aligned with the openings formed by the contact sections 56 and 76.

The insertion force required to insert the package 100 is designed to be less than 270 grams, as the package leads at 106, 106', 108, 108' will overstress at approximately 270 grams. To further insure that the package leads are not overstressed, standoff portions 16 are included above the package receiving face 12, such that the package sidewall 112 bottoms out on the standoff 16. As most integrated circuit packages are robotically assembled in a pick and place mode, the robot will sense the interference between the standoff 16 and the package 100. If the package 100 was inserted into the connector 2 without the standoffs, the ends of leads 110, 110' could bottom out against the contacts and be damaged before the robot sensed the resistance.

After the package 100 has been fully inserted, the instant design allows the continuity of the solder joint between the individual contacts 50 and the printed circuit board traces 132 to be tested. As the package receiving face is lowered to a recessed surface 18, probing instruments may be inserted under the package 100 and above the connector 2 for probing against the contacts 50.

The instant invention may also include an integral decoupling capacitor, as shown in FIG. 7. An integrated circuit package is decoupled from the power source for two purposes. First, when several integrated circuit packages demand power at the same time, the voltage in the power supply will drop because the power source cannot supply enough current to maintain the voltage. The capacitor will have enough electrical charge stored up to make up the difference and keep the integrated circuit packages operating. Secondly, when integrated circuit packages go through the refresh cycle, the voltage will change so rapidly that it will cause a spike in the power supply, and the capacitor will filter out those spikes.

In the preferred embodiment of the instant invention, the capacitor 152 is formed integrally with the contact portions 150, the capacitor being vapor phase soldered onto the contact portions 150. The contact portions 150 have the same constituent components as the contact portions 50, rather, instead of being sheared off at the height of the package receiving face 12, the contacts 150 includes capacitor mounting faces 154. Like the contacts 50, the contacts 150 can be formed in carrier strip form and robotically inserted.

A typical capacitor for decoupling an integrated circuit package is a 0.33 micro-farad, multi-layer ceramic capacitor manufactured by AVX, Inc. In order to decouple the integrated circuit package 100, one of the contact portions 150 is located at the power lead of the package and one contact portion 150 is located at the ground lead of the integrated circuit package.

With the decoupling capacitors mounted integrally with the contact portions, the instant invention further saves printed circuit board space, in that the capacitor does not have to be mounted directly on the printed circuit board, which, heretofore has been the practice.

As shown in FIG. 8, the addition of the decoupling capacitor to the contact portions 150 does not increase the side-by-side stacking clearance of the package sockets. The center-to-center spacing of the adjacent contacts in adjacent connectors can be maintained at 0.100 inches, as shown in FIG. 9 as Z.

Figure 11:
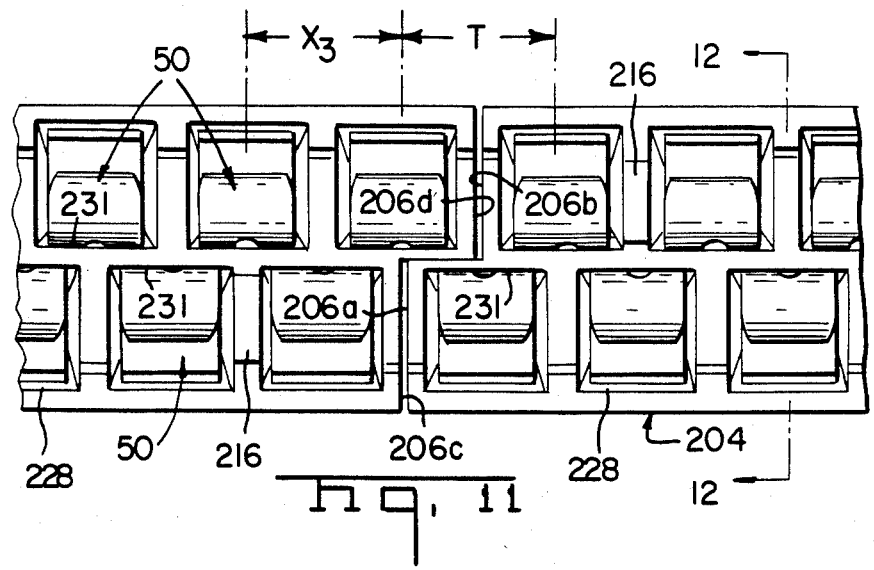
FIG. 11 is a top plan showing the end-to-end stacking capability of the alternate embodiment.

Although most applications require side-by-side stackability only, some applications do require end-to-end stacking capability. An alternate embodiment is shown in FIG. 10, which allows the sockets to be stacked end-to-end, maintaining the same center-to-center spacing between the adjacent contacts of adjacent sockets as the center-to-center spacing of adjacent contacts in the same socket. The housings 202 can be stacked end-to-end and still maintain the distance T between adjacent contacts of 0.100 inches, as shown in FIG. 11. The distance $X_3$ between adjacent contacts in the same socket is also 0.100 inches.

Referring now to FIG. 10, the alternate embodiment employs a design similar to that of the preferred embodiment except for the design of the endwalls 206 and the location of the package standoffs 216. The alternate embodiment includes endwalls 206a laterally offset from endwalls 206b, and endwalls 206c lateraly offset from endwalls 206d. This lateral offset allows the endwalls 206a, 206b of the adjacent connectors to abut endwalls 206c, 206d respectively, maintaining the same center-to-center distance between adjacent cavities of adjacent connectors as adjacent cavities in the same connector.

Figure 12:
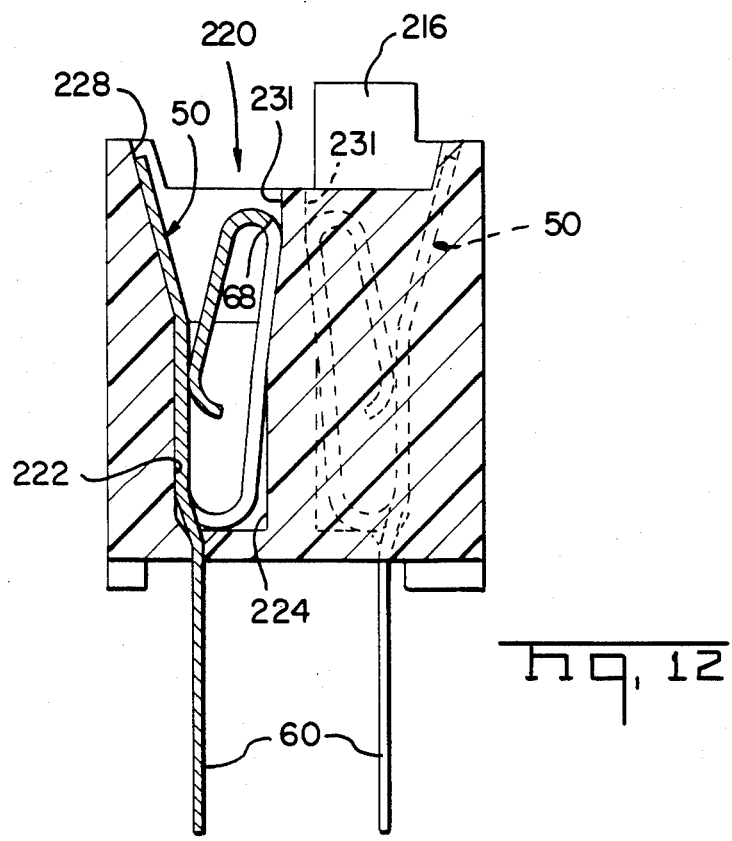
FIG. 12 is a cross-section through a cavity of the alternate embodiment.

In order to laterally offset the endwalls, the design of the cavities 220 must be modified. As shown in FIG. 10, the package standoffs 216 are moved to the interior portion of the connector housing 204. Also, as shown in FIG. 12, the interior sidewall 230 must be modified by returning to a vertical portion 231 above the contact location. Otherwise, the sidewall portion 230 would become too thin at the upper edge for molding. The vertical section 231 does not affect the performance of the contact, as the vertical section begins at the tangency point of the contact second radius 68 and the interior sidewall 230.

It should be understood that the disclosure is exemplary and not meant to limit the scope of the claims. Particularly, although the decoupling capacitor integral with the contact leads is shown in configuration with a connector for a zig-zag inline package, it should be understood that other connectors could also incorporate such a design.

What is claimed is:

1. An electrical socket for electrically connecting an integrated circuit package thereto, the package including a body portion and a lead frame portion having a plurality of leads all of which extend from one side edge of the body portion, the leads formed into two parallel rows with every other lead staggered, the socket comprising:

an insulative housing having axially extending sidewalls, endwalls and a central support rib which extends along the axial centerline of the housing, the housing having two parallel rows of contact receiving cavities opening onto an upper package receiving face, each row of cavities being on opposite sides of the central support rib, the cavities in a first row being axially staggered from the cavities in a second row, the lateral centerlines of the cavities in the first row being equally spaced between the lateral centerlines of adjacent cavities in the second row, the cavities being further defined by cavity walls which are transverse to the central support rib and laterally spaced to define the staggered cavities, the periphery of each cavity being defined by a floor having an aperture extending therethrough, and an inner surface as part of the central support rib which extends upwardly from and substantially perpendicular to the floor, the inner surface being in transition with an inner beveled surface which is part of the central support rib which projects towards the axial centerline of the housing, the intersection of the inner surface and the inner beveled surface defining a corner, the cavity periphery further including an outer surface as part of the sidewall which extends upwardly from and substantially perpendicular to the floor, the outer surface being in transition with an outer beveled surface as part of the sidewall which projects away from the axial centerline of the housing; and a plurality of terminals, each having a flared portion which lies flush with the outer beveled surface, the flared portion in transition with a first contact portion disposed flushly against the outer surface, the first contact portion in transition with a first reversely bent portion adjacent to the floor thereafter extending a terminal portion upwardly and into a second reversely bent portion which projects a diagonal portion downwardly and into a second contact portion which is in a preloaded condition against the fist contact portion, the upwardly extending terminal portion being in a contacting relation with the corner, the terminal further comprising a tail portion, struck from an interior of the upwardly extending terminal portion, and projecting through the aperture in the floor for interconnection to a printed circuit board.

2. The socket of claim 1 wherein the upwardly extending terminal portion is bent at a vertical position adjacent to the corner, to lie adjacent to the inner beveled surface.

3. The socket of claim 1 wherein the cavities in the first row are in an axially overlapping relationship with the cavities in the opposed second row.

4. The socket of claim 1 wherein the axial distance between centers of adjacent cavities is 0.100 inches.

5. The socket of claim 4 wherein the axial distance between consecutive cavities in opposed rows is 0.050 inches.

6. The socket of claim 1 wherein the distance between the axial centerlines of opposed rows is 0.100 inches.

7. The socket of claim 1 futher comprising standoffs integral with said housing profiled to contact the body of said integrated circuit package thereby locating the leads of said integrated circuit package at a desired depth in said cavity.

8. The socket of claim 1 wherein the housing means is profiled for end-to-end stacking with the axial spacing between adjacent cavities of adjacent connectors being equal to the axial spacing between adjacent cavities in the same connector.

9. The socket of claim 8 wherein the endwalls are staggered as the cavities, the endwall of the first row being axially recessed from the endwall of the second row at a first end, whereas the endwall of the second row is axially recessed from the endwall of the first row at a second end.

10. The socket of claim 9 wherein the endwalls are half the thickness of the cavity walls between adjacent cavities, and the portion of the central rib between the endwalls of the first and second two at each end is one-half the thickness of the remainder of the central rib portion.

11. The socket of claim 10 wherein the inner beveled surfaces, at a position proximate the second reversely bent portions, are in transition with vertical surfaces which extend to the package receiving face.

12. An electrical socket for interconnecting an integrated circuit package thereto and for decoupling said package, the integrated circuit package including a package body and a plurality of leads extending therefrom, the leads disposed in two parallel rows along said package, the socket comprising;

a housing means having a plurality of contact receiving cavities therein opening up to a package receiving face, the cavities being disposed in two parallel rows and spaced as said package leads;

a capacitor assembly including a capacitor means and at least two contact members, the contact members having a printed circuit board interconnection portion extending through an aperture in a floor of said cavity and extending below said housing means, the contact members further including contacting portions profiled for receipt in two of said contact receiving cavities and contacting said package leads upon insertion of said package leads therein, the contact members further including plate means integral with said contacting portions and upstanding above said package receiving face, the capacitor means being mechanically mounted and electrically connected to said plate means.

13. The socket of claim 12 wherein said capacitor means is sized to capacitively decouple said integrated circuit package.

14. The socket of claim 13 whrein the capacitor is soldered to said plate means.

15. The socket of claim 12 wherein the plate means are vertically disposed with the capacitor means mounted thereon, the capacitor means and plate means being disposed to a side of said socket to allow insertion of said package, while still maintaining side-to-side stackability of a plurality of said sockets.

16. An electrical socket for electrically connecting an integrated circuit package thereto, the package including a body portion and a lead frame portion having a plurality of leads all of which extend from one side edge of the body portion, the leads formed into two parallel rows with every other lead staggered, the socket comprising:

an insulative housing having axially extending sidewalls, endwalls and a central support rib which extends along the axial centerline of the housing, the housing having two parallel rows of contact receiving cavities opening into an upper package receiving face, each row of cavities being on opposite sides of the central support rib, the cavities in a first row being axially staggered from the cavities in a second row, the lateral centerlines of the cavities in the first row being equally spaced between the lateral centerlines of adjacent cavities in the second row, the cavities being further defined by cavity walls which are transverse to the central support rib and laterally spaced to define the staggered cavities, the periphery of each cavity being defined by a floor having an aperture extending therethrough, and an inner surface as part of the central support rib which extends upwardly from the floor, the cavity periphery further including an outer surface as part of the sidewall which extends upwardly from and substantially perpendicular to the floor, the outer surface being in transition with an outer beveled surface as part of the sidewall which projects away from the axial centerline of the housing; and a plurality of terminals having a flared portion which lies flush with the outer inclined surface, the flared portion being in transition with a first contact portion disposed flushly against the outer surface, the first contact portion being in transition with a first reversely bent portion adjacent to the floor thereafter extending a terminal portion upwardly and into a second reversely bent portion which projects a diagonal portion downwardly and into a second contact portion which is in a preloaded condition against the first contact portion, the upwardly extending terminal portion being diagonally disposed within the cavity away from the first contacting portion to space the second reversely bent portion therefrom, the terminal further comprising a tail portion, struck from an interior of the upwardly extending terminal portion, and projecting through the aperture in the floor for interconnection to a printed circuit board.

17. The socket of claim 16 wherein the inner surface is in transition with an inner beveled surface as part of the central support rib which projects towards the axial centerline of the housing, the intersection of the inner surface and the inner beveled surface defining a corner.

18. The socket of claim 17 wherein the upwardly extending terminal portion is positioned within the cavity such that the upwardly extending portion is in a contacting relation with the corner.

19. The socket of claim 18 wherein the upwardly extending terminal portion above the corner is bent towards the inner beveled surface thereby increasing the angle between the flared portion and the diagonal portion.

20. The socket of claim 19 wherein the portion of the upwardly extending terminal portion above the corner, and the downwardly directed diagonal portion are substantially parallel.

* * * * *

UNITED STATES PATENT OFFICE
CERTIFICATE OF CORRECTION

Patent No. 4,726,776　　　　　　　Dated February 23, 1988

Inventor(s) Timothy B. Billman; Joseph R. Goodman; Gary R. Marpoe, Jr.

It is certified that error appears in the above-identified patent and that said Letters Patent are hereby corrected as shown below:

In column 8, line 37, claim 10, change "two" to ---row---.

In column 9, line 4, claim 14, change "whrein" to ---wherein---.

Signed and Sealed this

Thirtieth Day of August, 1988

*Attest:*

DONALD J. QUIGG

*Attesting Officer*　　　　*Commissioner of Patents and Trademarks*